US008785306B2

(12) United States Patent
Guan et al.

(10) Patent No.: US 8,785,306 B2
(45) Date of Patent: Jul. 22, 2014

(54) MANUFACTURING METHODS FOR ACCURATELY ALIGNED AND SELF-BALANCED SUPERJUNCTION DEVICES

(75) Inventors: Lingpeng Guan, San Jose, CA (US); Madhur Bobde, Sunnyvale, CA (US); Anup Bhalla, Santa Clara, CA (US); Yeeheng Lee, San Jose, CA (US); John Chen, Palo Alto, CA (US); Moses Ho, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 274 days.

(21) Appl. No.: 13/200,683

(22) Filed: Sep. 27, 2011

(65) Prior Publication Data

US 2013/0075855 A1    Mar. 28, 2013

(51) Int. Cl.
H01L 29/06    (2006.01)
(52) U.S. Cl.
USPC ........... 438/495; 438/129; 438/404; 438/270; 438/430; 438/309; 438/138; 257/371; 257/487; 257/511; 257/330; 257/338; 257/E21.557; 257/E21.558; 257/E21.337; 257/E21.375; 257/E29.066
(58) Field of Classification Search
USPC .................. 257/E21.383, E21.418, E29.013, 257/E29.198, E29.257, E29.327, E29.338, 257/200, 655, 285; 438/138
See application file for complete search history.

(56) References Cited

U.S. PATENT DOCUMENTS

| 5,216,275 | A | 6/1993 | Chen | |
|---|---|---|---|---|
| 6,960,798 | B2* | 11/2005 | Deboy et al. | 257/285 |
| 8,421,196 | B2* | 4/2013 | Weber et al. | 257/655 |
| 2003/0148559 | A1* | 8/2003 | Onishi et al. | 438/138 |
| 2005/0035371 | A1* | 2/2005 | Fujihira | 257/200 |
| 2010/0044792 | A1* | 2/2010 | Hebert | 257/341 |
| 2011/0001187 | A1* | 1/2011 | Hebert | 257/330 |
| 2011/0049564 | A1* | 3/2011 | Guan et al. | 257/147 |
| 2011/0073906 | A1* | 3/2011 | Bobde et al. | 257/147 |
| 2011/0147836 | A1* | 6/2011 | Hebert | 257/334 |

\* cited by examiner

Primary Examiner — Jerome Jackson, Jr.
Assistant Examiner — Bo Fan
(74) Attorney, Agent, or Firm — Bo-In Lin

(57) ABSTRACT

A method for manufacturing a semiconductor power device on a semiconductor substrate supporting a drift region composed of an epitaxial layer by growing a first epitaxial layer followed by forming a first hard mask layer on top of the epitaxial layer; applying a first implant mask to open a plurality of implant windows and applying a second implant mask for blocking some of the implant windows to implant a plurality of dopant regions of alternating conductivity types adjacent to each other in the first epitaxial layer; repeating the first step and the second step by applying the same first and second implant masks to form a plurality of epitaxial layers then carrying out a device manufacturing process on a top side of the epitaxial layer with a diffusion process to merge the dopant regions of the alternating conductivity types as doped columns in the epitaxial layers.

5 Claims, 16 Drawing Sheets

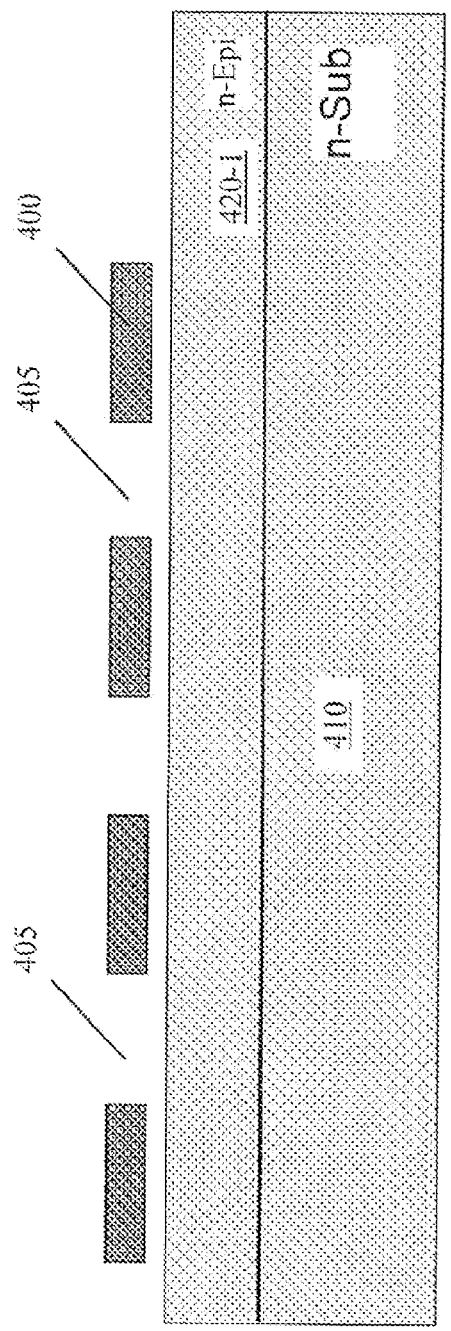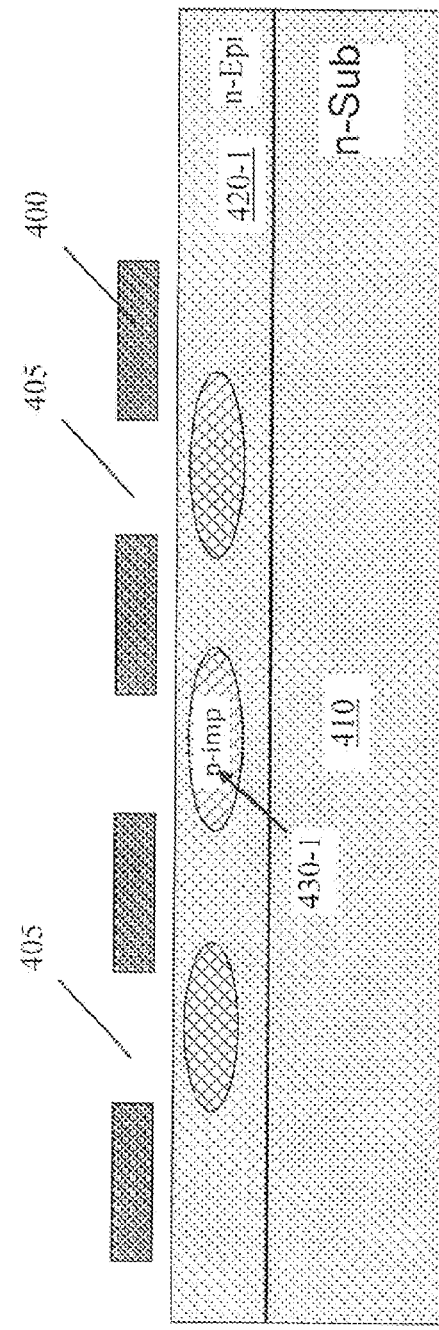
FIG. 5A
FIG. 5B

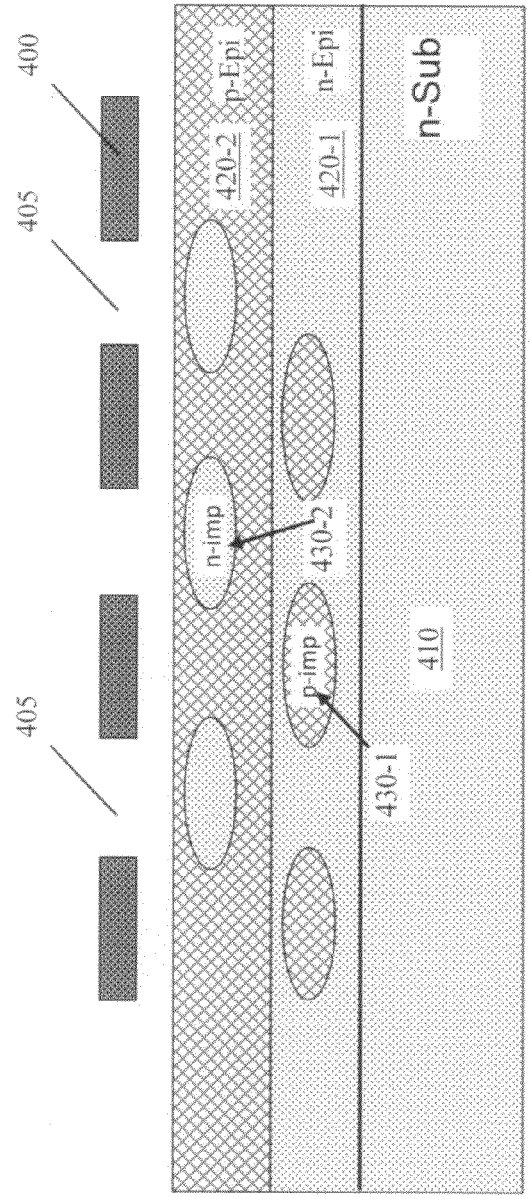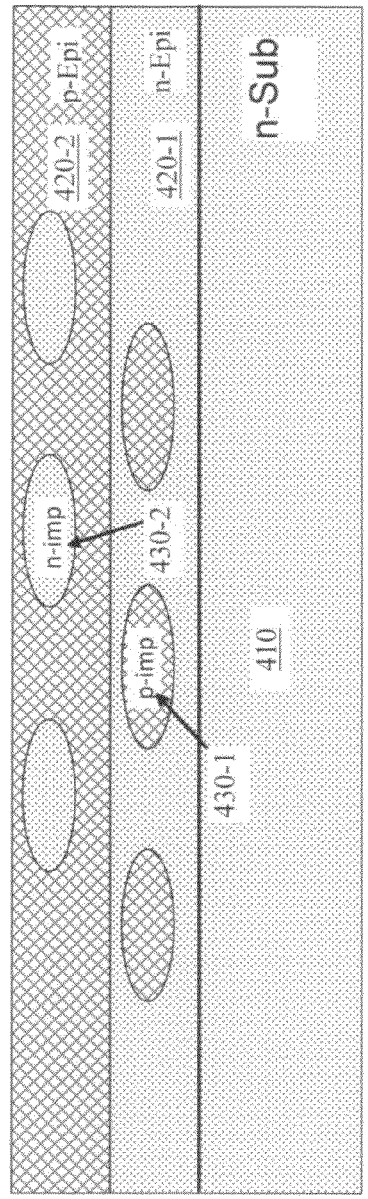
FIG. 5E
FIG. 5F

MANUFACTURING METHODS FOR ACCURATELY ALIGNED AND SELF-BALANCED SUPERJUNCTION DEVICES

BACKGROUND OF THE INVENTION

1. Field of the Invention

The invention relates generally to the vertical semiconductor power devices. More particularly, this invention relates to configurations and methods with improved manufacturability for manufacturing vertical semiconductor power devices with a super-junction structure for high voltage applications.

2. Description of the Prior Art

Conventional manufacturing technologies and device configuration to further increase the breakdown voltage with reduced series resistance with a super-junction configuration are still confronted with difficulties and limitations of manufacturability. The practical applications and usefulness of the high voltage semiconductor power devices are limited due to the facts that the conventional high power devices manufactured with super-junction structural features now encounter difficulties to satisfy the more stringent processing windows. Specifically, when the target RdsA is reduced from 20 mohm/cm$^2$ to 10 mohm/cm$^2$, the allowable charge balance variation is reduced from 30% to 10%. However, the conventional techniques cannot achieve such requirements due to the variation of the N charge for doping the epitaxial layer. When the conventional double implant processes are applied to form the super-junction, a variation of N charge for doping the epitaxial layer can be controlled within 1% to 2%. However, due to the variation of the critical dimension (CD) in controlling the alignment of the dopant implantations, especially for devices with small pitches, the charge variation may increase to 10 to 20% when multiple implant masks are applied using conventional manufacturing process. The performance of the super-junction is adversary affected due to the uncontrollable variations of the N charge in the epitaxial layer cannot be further reduced.

FIG. 1A shows a semiconductor power device disclosed in U.S. Pat. No. 5,216,275, to Chen. The semiconductor power device is supported on a superjunction structure formed as composite buffer (CB) layer comprises N and P doped regions. However, the variations of charges between the P-doped regions and the N-doped regions in the super-junction structure are significantly beyond the device requirements as now used in the device for more modern applications. For example, as that included in one of the claims, the semiconductor power device that includes the first and second semiconductor regions are doped with dopants and the total charge of the effective dopant concentration in the first semiconductor region does not exceed the total charge of the effective dopant concentration of the second semiconductor region by 50%. The disclosures of Chen therefore cannot satisfy the more stringent device requirements as now imposed on such devices.

FIG. 1B shows another super junction device disclosed by Deboy in U.S. Pat. No. 6,960,798. As shown in FIG. 1B, the cross sectional view of a cell design of the super-junction structure has a drain D, a source S, and a gate G, the n+ conductive semiconductor substrate 1, an n-conductive semiconductor region 13, the n-conductive layer 3, and n-conductive regions 4 as well as p-conductive regions 5 under the source electrode S. The degrees of compensation, for example, between +30% and −20% are reported, whereby a degree of compensation "0" indicates true compensation between n-doping and p-doping. Here, the doping thus varies within the "p-column" by a factor 3 whereas the doping in the "n-columns" is constant. Such dopant variations, even with compensations as disclosed would still not be satisfactory to meet the requirements of current applications with more stringent design windows.

FIG. 1C shows a cross sectional view of a multiple epitaxial superjunction structure formed by a conventional manufacturing process. The method includes a first step of growing a first N-epitaxial layer 320-1 on an N-substrate 310; a second step of applying a first implant mask 300 to open a plurality of implant windows 315 to implant a plurality of P-dopant regions 330-1 in the first N-epitaxial layer 320-1; the first step and the second step are repeated with the second N-epitaxial layer 320-2 formed on top of the first N-epitaxial layer 320-1 and so on. The P-dopant regions are diffused to merge the P-dopant regions 330 as doped columns in the N-epitaxial layers 320. However, in this method, due to the variation of the critical dimension (CD) in controlling the alignment of the dopant implantations, the total charge variation may increase.

Since the super-junction devices can significant reduce the on resistance of the semiconductor power devices, there is a great demand for such power devices for applications on devices required for power savings, particularly in portable electronic devices.

Therefore, a need still exists in the art of power semiconductor device design and manufacture to provide new device configurations and manufacturing method in forming the power devices supported on a super-junction structure such that the above discussed problems and limitations can be resolved.

SUMMARY OF THE PRESENT INVENTION

It is therefore an aspect of the present invention to provide a new and improved manufacturing method to form the doped columns with alternate conductivity types in the drift regions for charge balance with more accurately controllable critical dimension of the doped regions to reduce the variations of charges in the doped regions. Specifically, the P-implant and N-implant windows are defined simultaneously such that the adverse effects caused by critical dimension imbalance that leads to charge imbalance can be effectively prevented. The hard mask to define the implant windows can be formed by layers of oxide, photoresist or other materials with implant windows defined and opened through the layer.

Specifically, it is an aspect of the present invention to provide a new and improved manufacturing method to form the doped columns in the epitaxial drift region for charge balance by consistently applying a P-implant mask and an N-implant mask in the processes of growing multiple epitaxial layers and implanting P-doped regions and N-doped regions repeatedly such that the variations of column alignment can be reduced and the critical dimension of the P and N columns can be more strictly controlled to reduced the variation of total charges in these doped columns of alternate conductivity types.

Briefly in a preferred embodiment this invention discloses a method for manufacturing a semiconductor power device on a semiconductor substrate supporting a drift region composed of an epitaxial layer. The method includes a first step of growing a first epitaxial layer on a semiconductor substrate followed by forming a first hard mask layer on top of the epitaxial layer; a second step of applying a first implant mask to open a plurality of implant windows and applying a second implant mask for blocking some of the implant windows to implant a plurality of dopant regions of alternating conductivity types adjacent to each other in the first epitaxial layer; and a third step of repeating the first step and the second step by applying the same first and second implant masks to form a plurality of epitaxial layers, each of which is implanted with the dopant regions of the alternating conductivity types. In another embodiment, the manufacturing method further includes a step of carrying out a device manufacturing process on a top side of the epitaxial layer on top of the dopant regions of the alternating conductivity types with a diffusion process to merge the dopant regions of the alternating conductivity types as doped columns in the epitaxial layers.

Furthermore, this invention discloses a method of manufacturing a semiconductor power device on a semiconductor substrate supporting a drift region composed of an epitaxial layer. The method includes a step of forming a first hard mask layer on top of the epitaxial layer followed by applying a first implant mask to open a plurality of first set of implanting windows then carrying out a plurality of implants with dopant ions of a first conductivity type to form a plurality of dopant regions of the first conductivity type in the epitaxial layer; a second step of forming a second hard mask layer filling in the first set of implanting windows followed by planarization of the second hard mask layer and removing of the first hard mask layer to form a second set of implanting windows then carrying out a plurality of implants with dopant ions of a second conductivity type to form a plurality of dopant regions of the second conductivity type in the epitaxial layer; and a third step of repeating the first step and the second step by applying the same first and second implant masks to form a plurality of epitaxial layers, each of which is implanted with the dopant regions of the opposite conductivity types. In another embodiment, the manufacturing method further includes a step of carrying out a device manufacturing process on a top side of the epitaxial layer on top of the dopant regions of the alternating conductivity types with a diffusion process to merge the dopant regions of the alternating conductivity types as doped columns in the epitaxial layer.

Additionally, this invention discloses a method of manufacturing a semiconductor power device on a semiconductor substrate supporting a drift region composed of an epitaxial layer. The method includes a step of 1) forming a first hard mask layer on top of a first epitaxial layer doped with a first conductivity followed by applying a first implant mask to open a plurality of first set of implanting windows then carrying out an implant with dopant ions of a second conductivity type to form a plurality of dopant regions of the second conductivity type in the first epitaxial layer; 2) removing the first hard mask followed by forming a second epitaxial layer of the second conductivity type then forming a second hard mask layer on top of the second epitaxial layer followed by applying a second implant mask to open a plurality of second set of implanting windows to carry out an implant with dopant ions of the first conductivity type in the second epitaxial layer to form a plurality of dopant regions of the first conductivity type vertically between two of the dopant regions of the second conductivity type in the first epitaxial layer; and 3) repeating the step 1) and step 2) by applying the same first and second implant masks to form a plurality of epitaxial layers with alternating conductivity regions with conductivity type opposite from the conductivity type of the epitaxial layer. In a preferred embodiment, the method further includes steps of carrying out a device manufacturing process on a top epitaxial layer on top of the dopant regions of the alternating first and second conductivity types; and performing a diffusion process to merge the dopant regions of the alternating conductivity types as doped columns in the epitaxial layers.

The invention further provides a semiconductor power device on a semiconductor substrate supporting a drift region comprising a plurality of epitaxial layer of alternating conductivity type stacking alternately in a vertical direction and a plurality of P and N vertical columns arranged alternately with each other in a lateral direction perpendicular to the vertical direction. In one embodiment, each epitaxial layer comprises a plurality of space apart doped regions of conductivity type opposite to a conductivity type of the epitaxial layer wherein the doped regions of same conductivity type in different epitaxial layer aligned with each other forming the P and N vertical columns. In another embodiment, each P or N column comprises multiple evenly doped epitaxial regions and multiple diffused dopant profile regions arranged alternately with each other. In yet another embodiment, each of the diffused regions has a convex sidewall boundary and each of the epitaxial regions has a concave sidewall boundary. Each of the diffused region may have a maximum lateral width located substantially in the center of the diffused region and a minimum width located at an interface with the epitaxial region of the same conductivity while each of the epitaxial region may have a minimum lateral width located substantially in the center of the epitaxial region and a maximum lateral width at the interface with the diffused region of the same conductivity; in a preferred embodiment, the minimum lateral width of the diffused region is substantially the same as the maximum lateral width of the epitaxial region of the same conductivity interfacing each other.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 5A-5G are cross sectional views illustrating processing steps of an alternative method for manufacturing a superjunction structure with more accurately alignment control of the doped regions to form the doped columns of alternate conductivity to reduce the total charge variations of the super-junction devices.

DETAILED DESCRIPTION OF THE METHOD

Figure 1A:
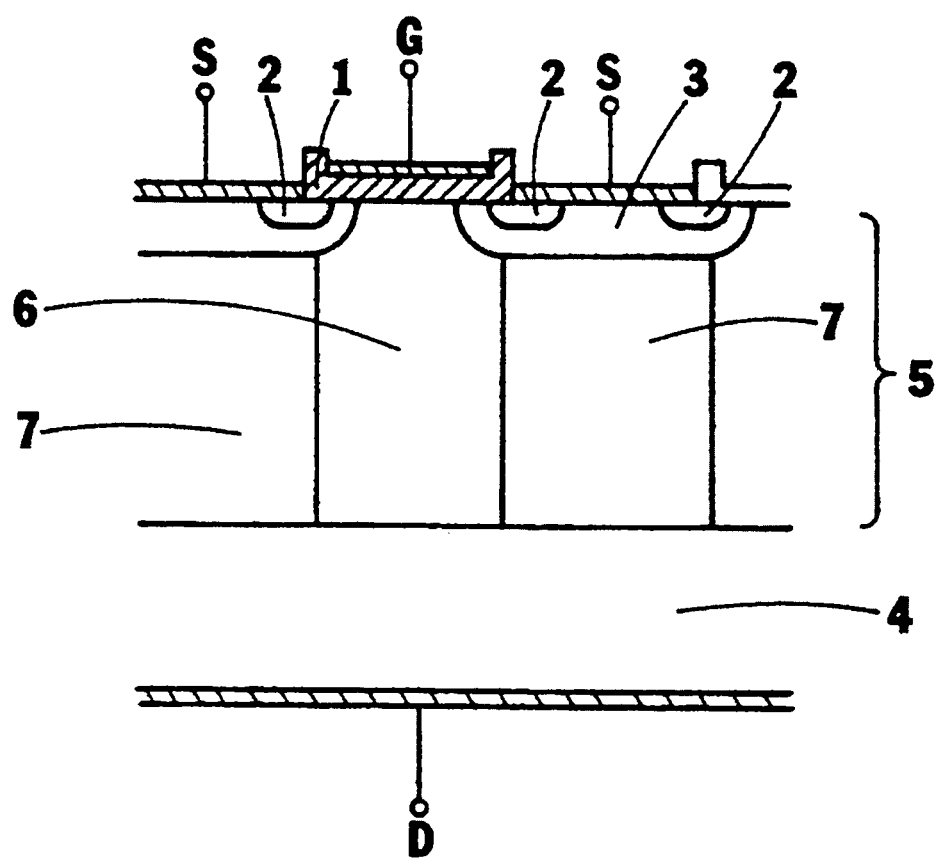
FIGS. 1A to 1C are cross sectional views for showing conventional vertical power device configurations manufactured by conventional methods.
Figure 1B:
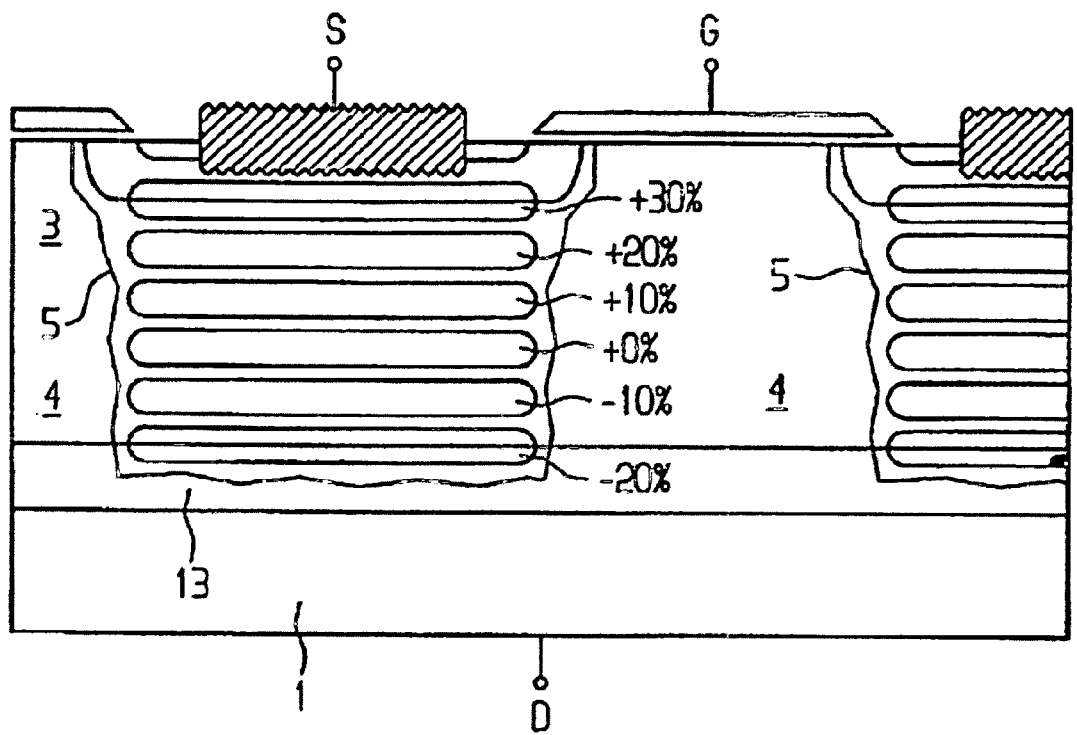
Figure 1C:
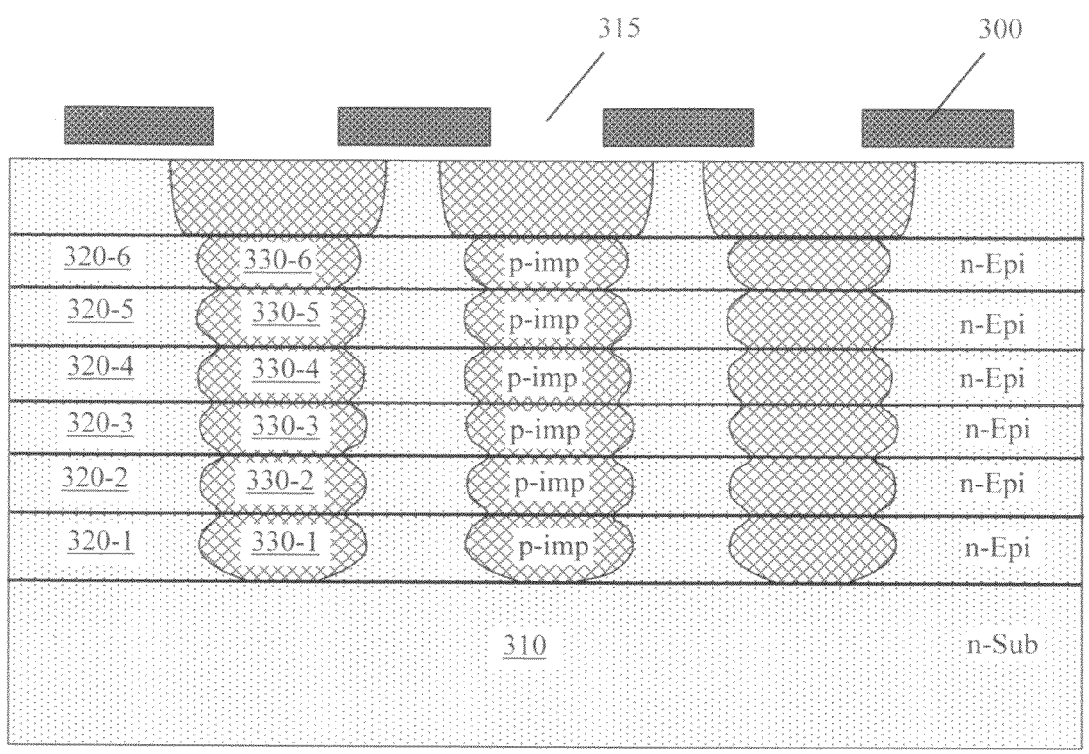
Figure 2A:
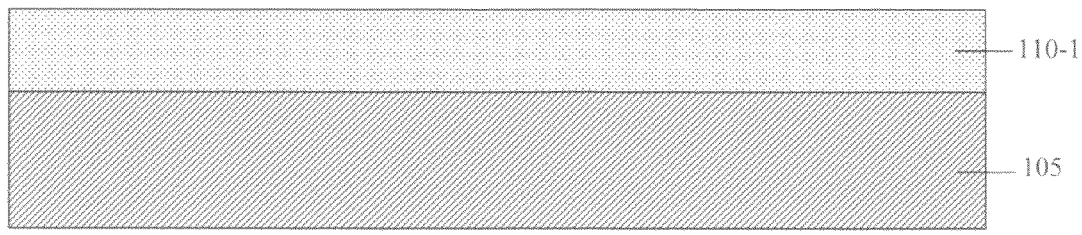
FIGS. 2A to 2I are a series of cross sectional views for illustrating the manufacturing processes of this invention to manufacture a super-junction structure with more accurately alignment control of the doped regions to form the doped columns of alternate conductivity to reduce the total charge variations of the super-junction devices.
Figure 2B:
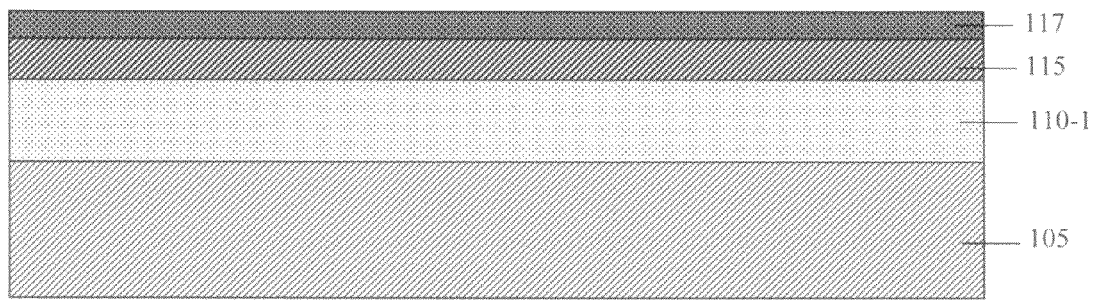
Figure 2C:
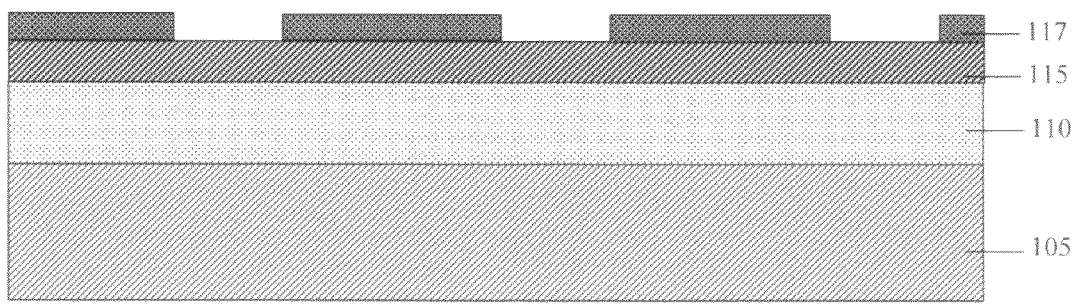
Figure 2D:
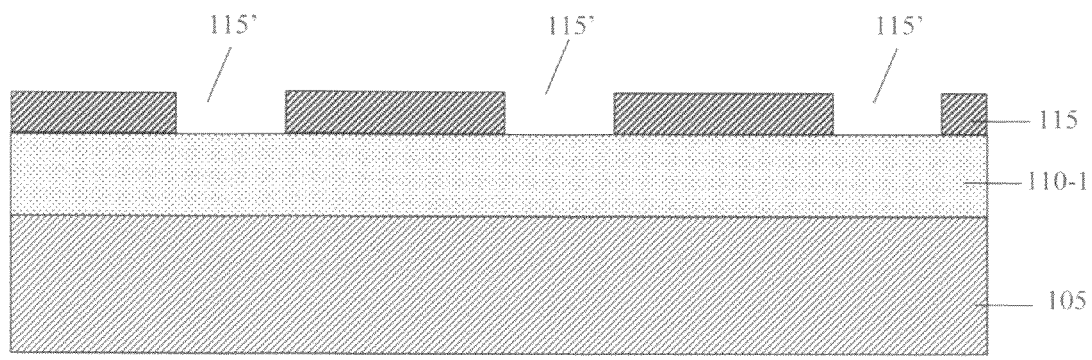
Figures 1, 2E:
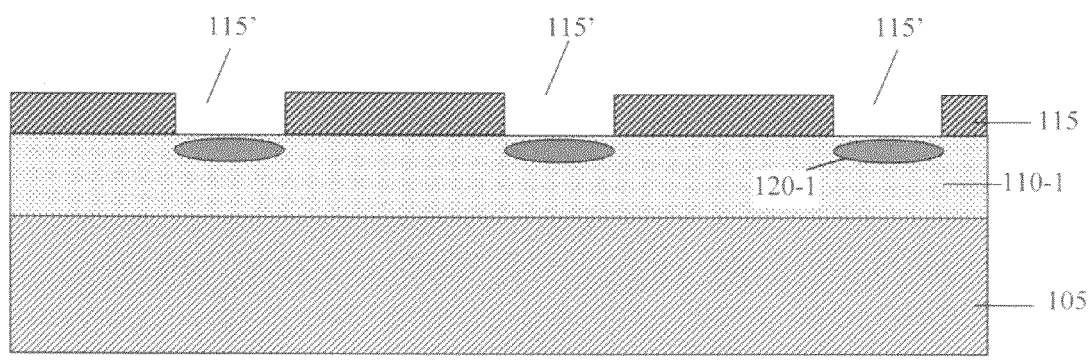

Referring to FIGS. 2A to 2K for a series of cross sectional views for illustrating the processing steps to manufacture a superjunction structure for supporting a semiconductor power device. As shown in FIG. 2A, the manufacturing processes starts from forming an undoped epitaxial layer 110-1 on a heavily doped silicon substrate 105, for example an N-type substrate, followed by forming a hard mask layer 115 and a photoresist coat layer 117 on top of the epitaxial layer 110-1 (FIG. 2B). In FIG. 2C, the photoresist layer 117 is patterned by a mask and the hard mask layer 115 is exposed followed by carrying out a photolithographic etching process to pattern the hard mask layer 115 to form a plurality of implant windows 115' (FIG. 2D). FIG. 2E-1 shows a first manufacturing approach using only the hard mask by carrying out a N-type ions implant, e.g., phosphorus implant, to form a plurality of N doped regions 120-1 in the epitaxial layer 110-1 followed by applying a P-implant mask 119 as that shown in FIG. 2F-1 to carry out an implant of P-type ions to form a plurality of P-doped regions 125-1. The P-implant mask 119 may be a photo resist disposed on top of the hard mask blocking the hard mask openings in the locations where N columns are intended to form and having opening where the P columns are intended to form. The P-type ions counter-dope the N-type ions in this region. The P-type and N-type ions are implanted at an energy between 50 keV and 500 keV and a constant dose between 1e12 cm$^{-2}$ to 1e14 cm$^{-2}$.

Figures 2, 2E:
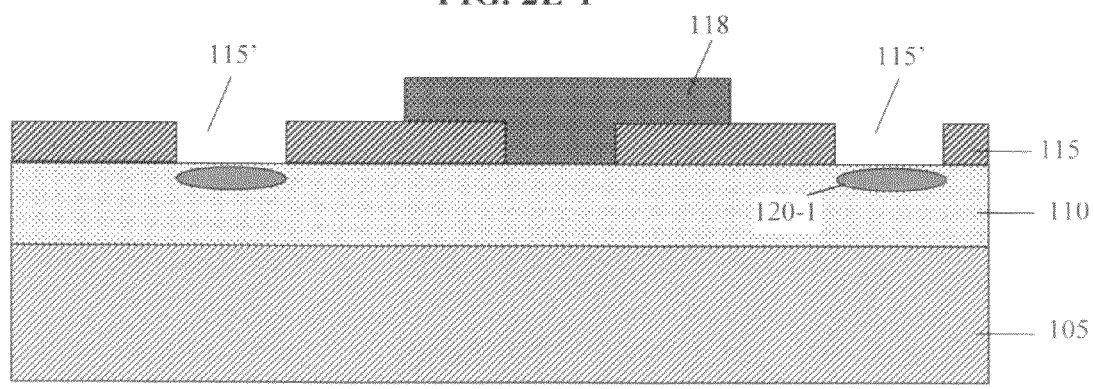
Figures 1, 2F:
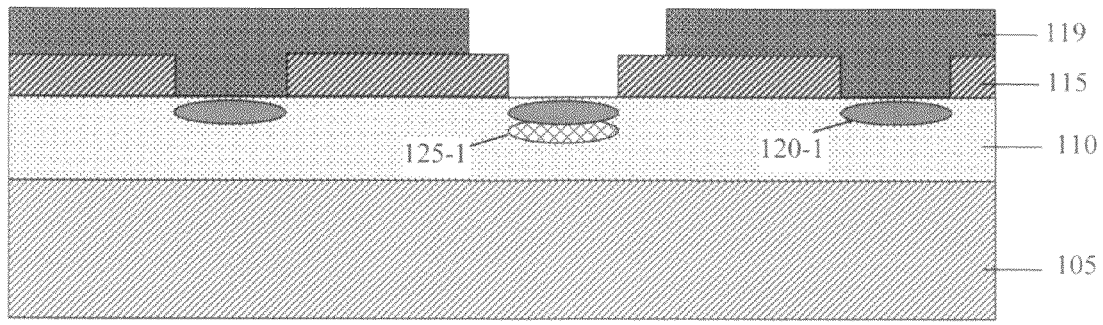
Figures 2, 2F:
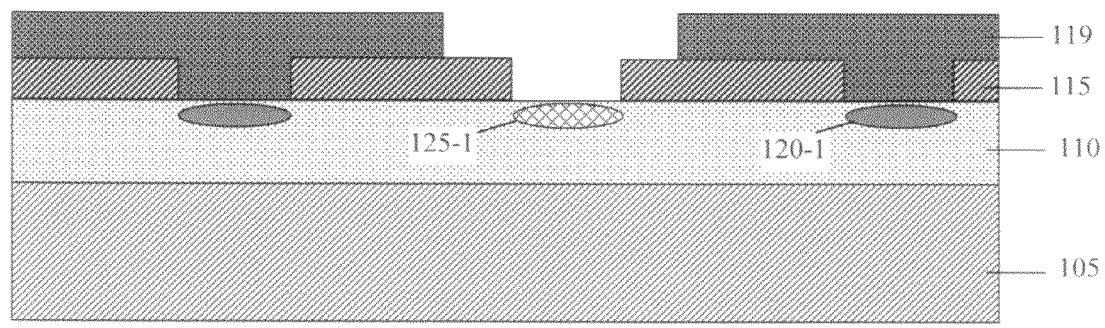

FIG. 2E-2 shows a second manufacturing approach by first applying an N-type implant block mask 118 to block some of windows 115' to carry out a phosphorous implant to form the N-doped regions 120-1 in the epitaxial layer 110-1 under the unblocked windows 115' followed by removing N-type implant mask 118 and applying a P-implant mask 119 as that shown in FIG. 2F-2 to carry out an implant of P-type ions to form a plurality of P-doped regions 125-1. The N-implant mask 118 may be a photo resist disposed on top of the hard mask blocking the hard mask openings in the locations where P columns are intended to form and having opening where the N columns are intended to form. The P-implant mask 119 may be a photo resist disposed on top of the hard mask blocking the hard mask openings in the locations where N columns are intended to form and having opening where the P columns are intended to form. In this approach the P type dopant dosage can be adjusted differently from the approached in FIGS. 2E-1 and 2F-1, for example between 1e12 cm$^{-2}$ to 1e14 cm$^{-2}$.

Figure 2G:
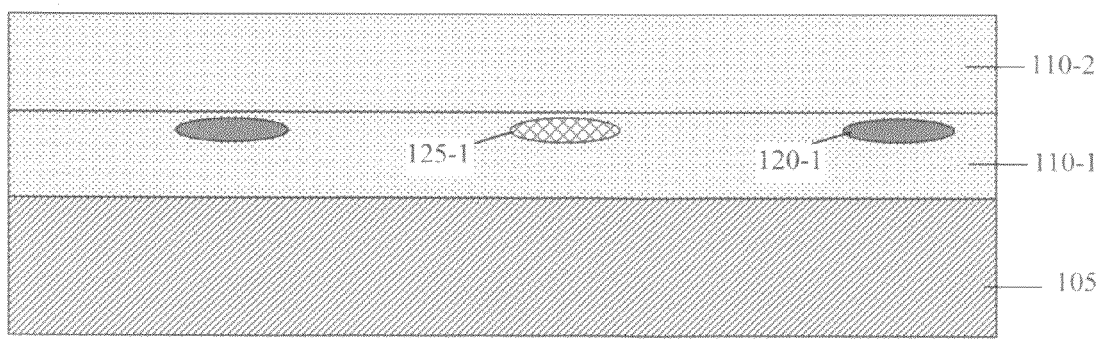
Figure 2H:
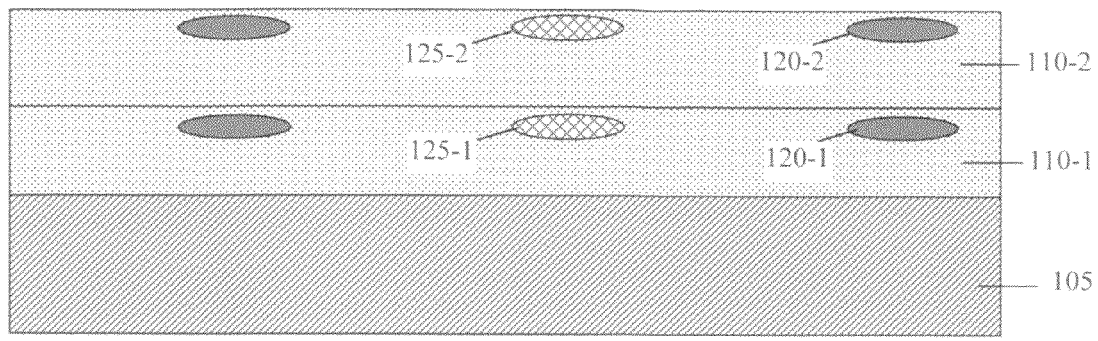
Figure 2I:
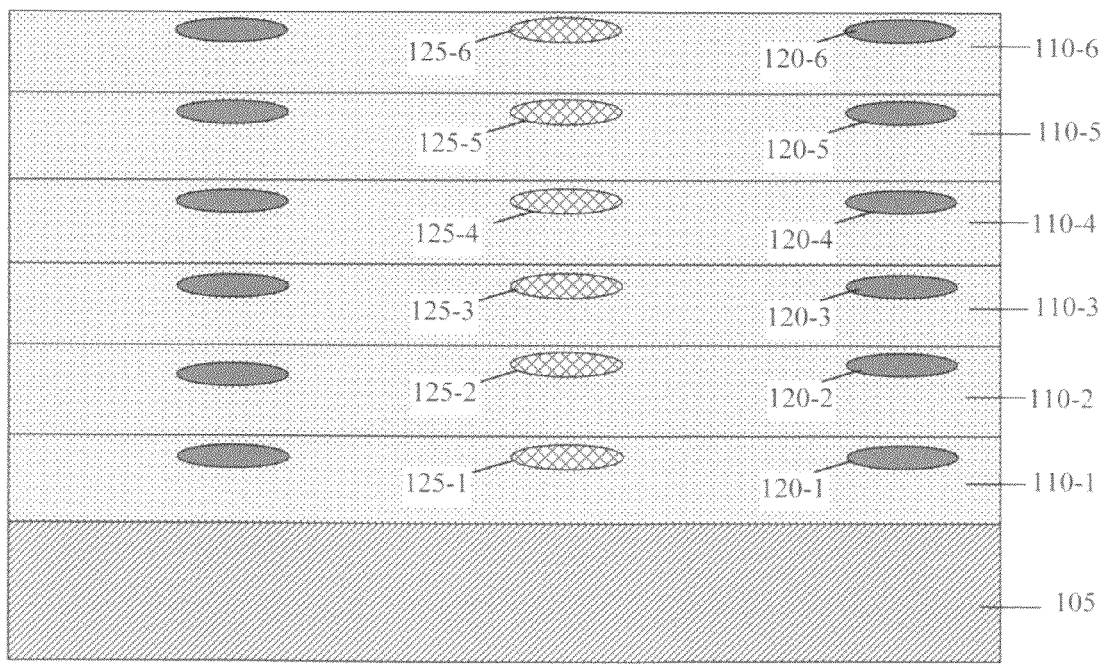

FIG. 2G shows the hard mask 115 is removed followed by growing a second epitaxial layer 110-2 and repeating the processes shown in FIGS. 2B to 2G to form another row of N-doped regions 120-2 and P-doped regions 125-2 as shown in FIG. 2H. The processes as that shown in FIGS. 2A to 2H are repeated six to eight times to form columns of N-doped regions 120-1 to 120-6 and P-doped regions 125-1 to 125-6 as that shown in FIG. 2I.

Figure 3:
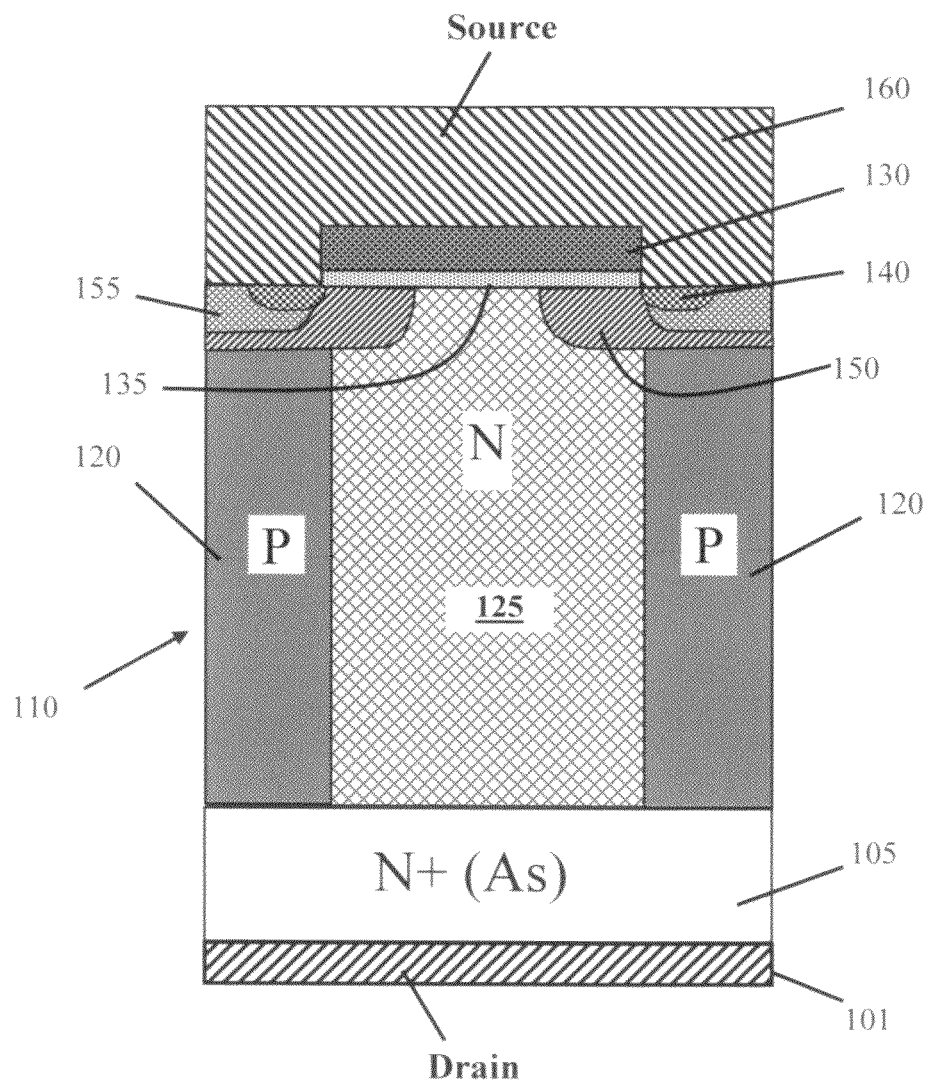
FIG. 3 is a cross sectional view of a device supported on a super-junction structure manufactured by applying the manufacturing method shown in FIG. 2A to 2I.

In FIG. 3, a top side device manufacturing processes are carried out including a long diffusion by applying an elevated temperature to merge the P-dopant regions 120-1, 120-2, to 120-L (not specifically shown) and N-dopant regions 125-1 to 125-L, where L is a positive integer number, as P-dopant columns 120 and N-dopant columns 125. As an exemplary embodiment, a planar MOSFET device is shown in FIG. 3 that has a planar gate 130 insulated by a gate oxide layer 135 from the source regions 140 encompassed in a body region 150 formed in an epitaxial layer above the P-doped columns 120 and the N-doped columns 125. A source metal layer 160 is in contact with the body and source regions through a doped contact region 155 formed in the body region 150 near the top surface of the epitaxial layer 110 that comprises a plurality of P-doped columns 120 and N-doped columns 125 constituting a super-junction structure to support the MOSFET device formed on the top side of the super-junction structure. A drain metal layer 101 is formed at the bottom of the substrate 105.

Figure 4A:
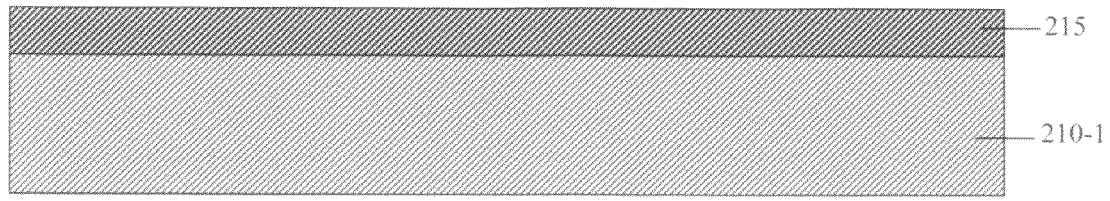
FIGS. 4A to 4K are a series of cross sectional views to illustrate processing steps of this invention to manufacture a superjunction structure with more accurately alignment control of the doped regions to form the doped columns of alternate conductivity to reduce the total charge variations of the super-junction devices.
Figure 4B:
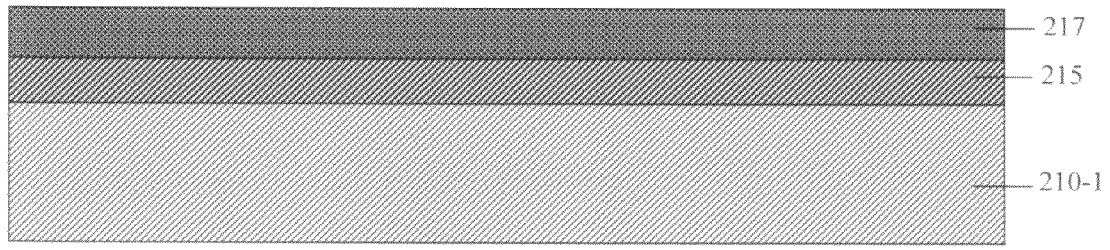
Figure 4C:
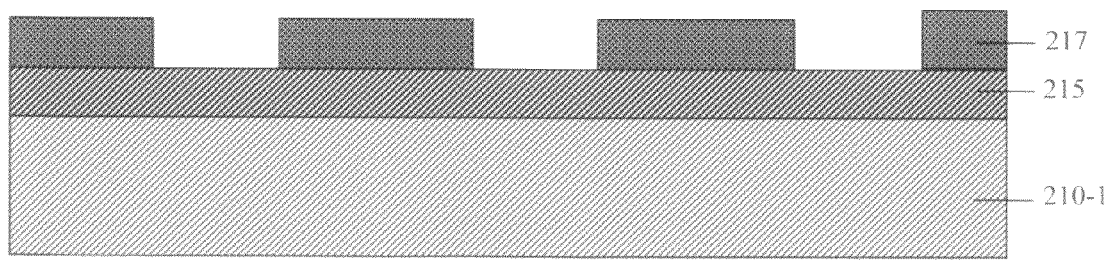
Figure 4D:
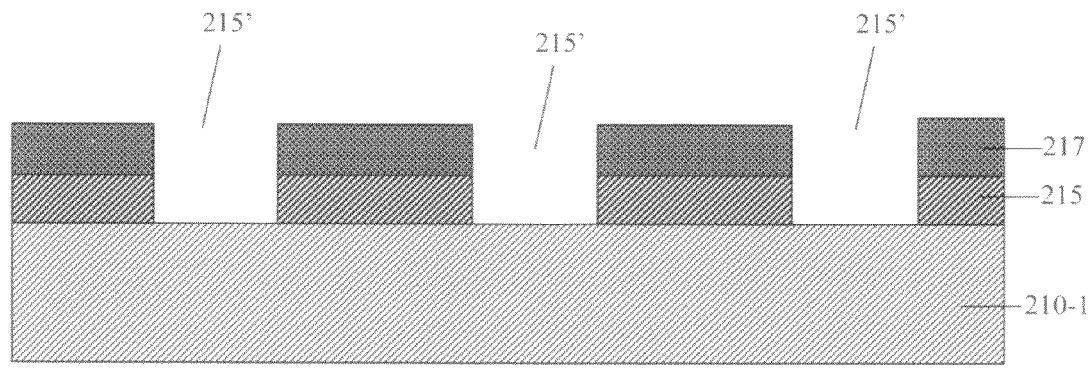
Figure 4E:
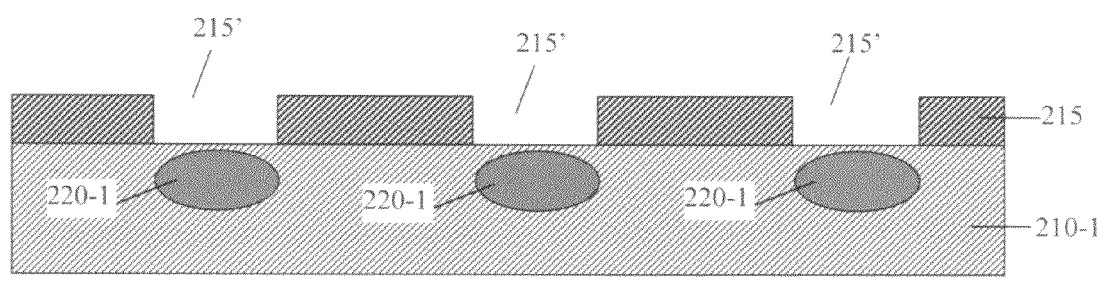

Referring to FIGS. 4A to 4K for a series of cross sectional views for illustrating the alternative processing steps to manufacture a superjunction structure for supporting a semiconductor power device. As shown in FIG. 4A, the manufacturing processes starts forming a first hard mask layer 215, such as oxide, on top of a first undoped epitaxial layer 210-1 that may be supported on a semiconductor substrate (not shown). In FIG. 4B, a photoresist layer 217 is formed on top of the hard mask layer 215. In FIG. 4C, the photoresist layer 217 is patterned and the hard mask layer 215 is exposed followed by carrying out a photolithographic etching process to pattern the hard mask layer 215 to form a plurality of implant windows 215' (FIG. 4D). In FIG. 4E, the photoresist layer 217 is removed followed by carrying out multiple implantation processes with a first conductivity type of dopant ions through the implant windows 215'. The implant processes form a plurality of dopant regions 220-1 of the first conductivity type, e.g., N-doped regions 220-1 in the semiconductor substrate 210-1.

Figure 4F:
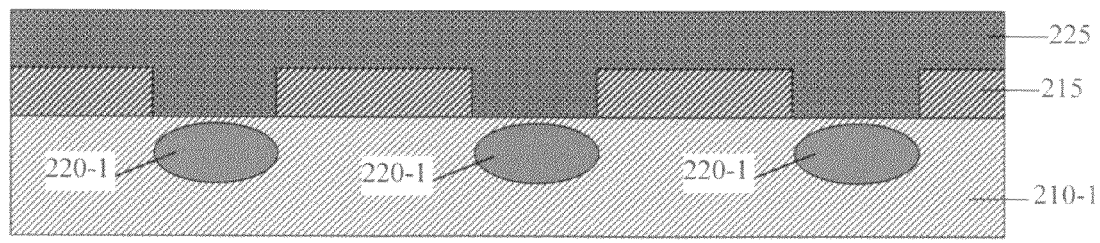
Figure 4G:
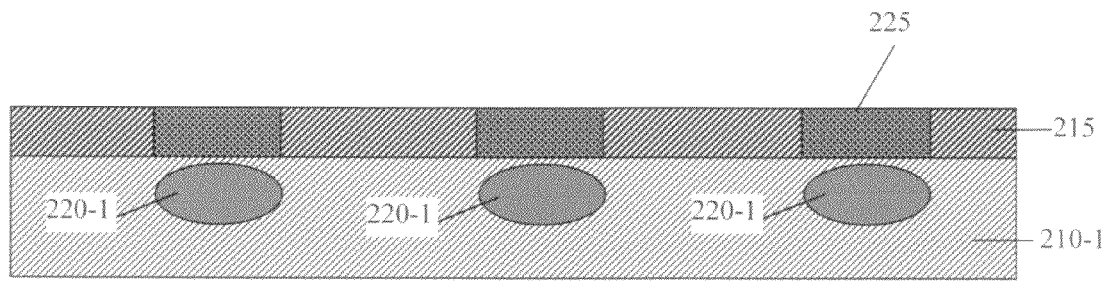
Figure 4H:
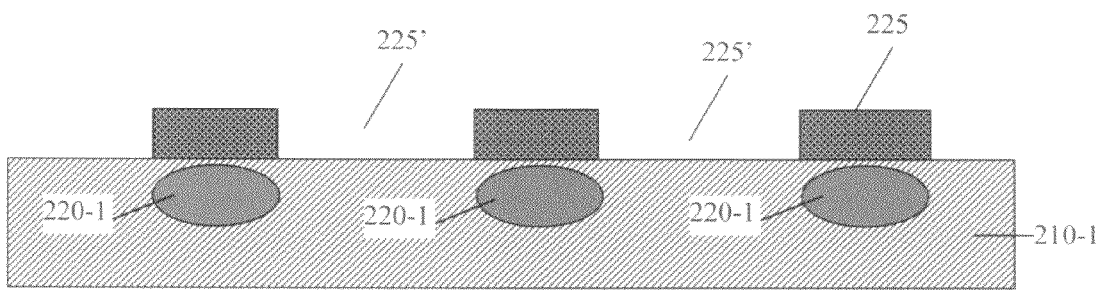
Figure 4I:
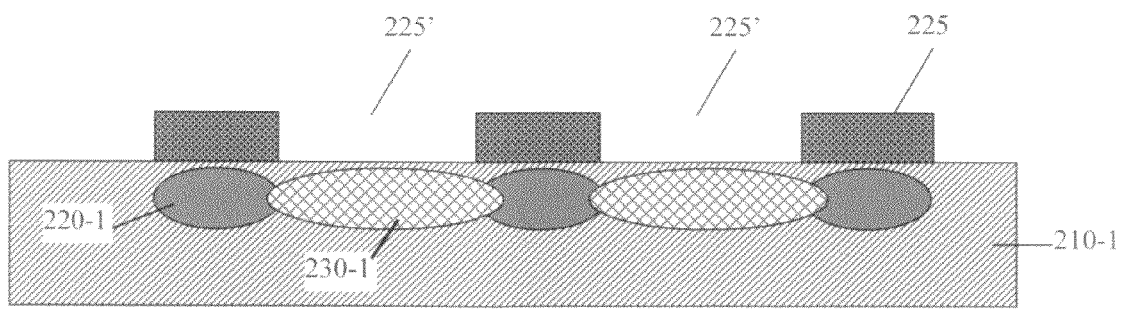

In FIG. 4F, a second hard mask layer 225 is formed by deposited on top of the first hard mask layer 215 and filled in the windows 215' a dielectric material, that is different from the material forming the first hard mask, such as a nitride, followed by an etching back process (FIG. 4G) using a first etchant to remove the second hard mask material on top of the first hard mask to expose the first mask material. In FIG. 4H, the first hard mask 215 is removed by a blank etch using a second etchant different from the first etchant and the second hard mask layer 225 is kept to expose another set of implanting window 225'. In FIG. 4I, one or multiple implantation processes are performed with dopant ions of second conductivity type through the implant windows 225'. The implant processes form a plurality of dopant regions 230-1 of a second conductivity type, e.g., P-doped regions 230-1 in the semiconductor substrate 210-1.

Figure 4J:
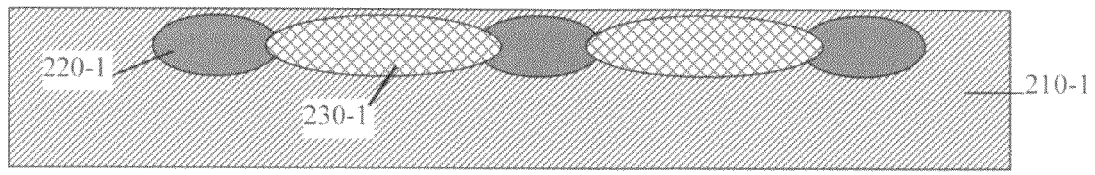
Figure 4K:
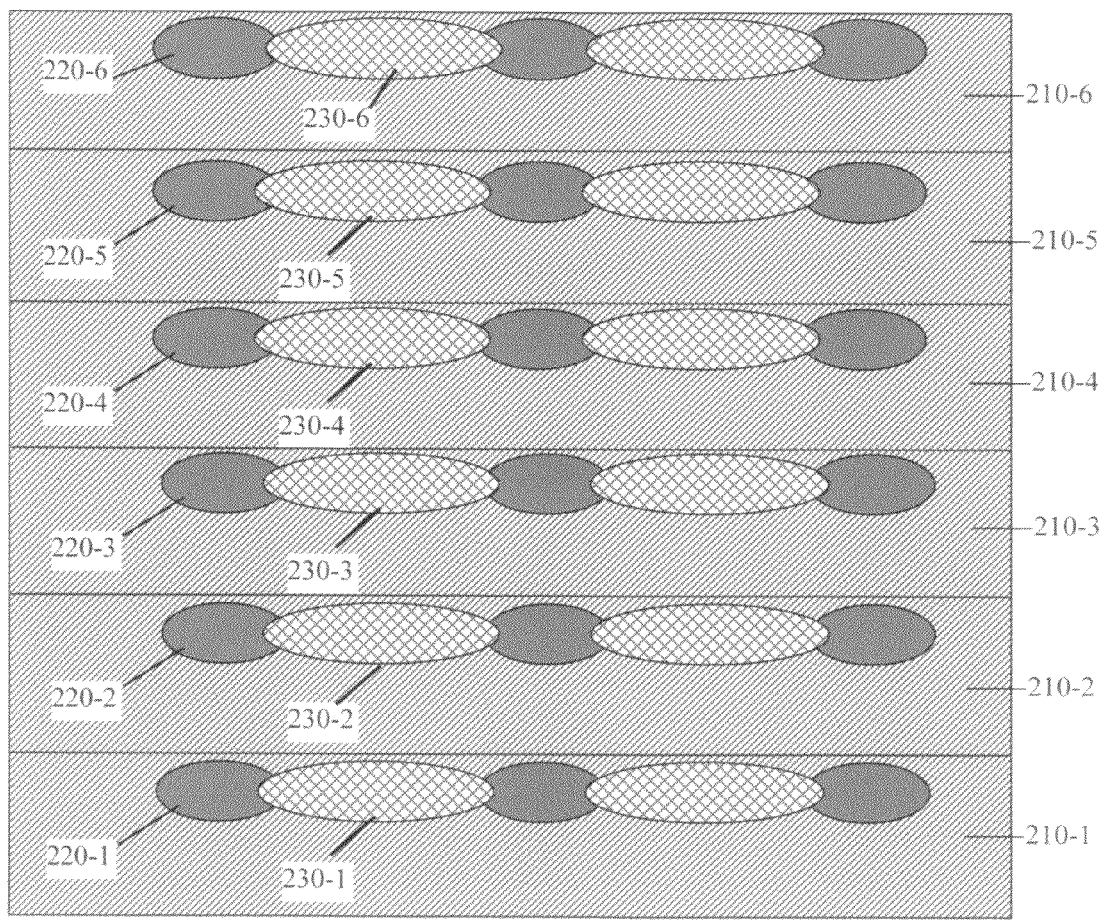

FIG. 4J shows the second hard mask 225 is removed. The process of growing an undoped epitaxial layer 210-2 and the steps shown in FIGS. 4A to 4J are repeated six to eight times to form columns of N-doped regions and P-doped regions. FIG. 4K shows the superjunction structure includes six N-doped regions 220-1 to 220-6 and six P-doped regions 230-1 to 230-6.

The manufacturing processes proceed with the top side device manufacturing processes as that shown in FIG. 3 where the processes are carried out including a long diffusion by applying an elevated temperature to merge the P-dopant regions 220-1, 220-2, to 220-L and N-dopant regions 230-1 to 230-L, where L is a positive integer representing the number of row of N-doped and P-doped regions formed.

Figure 5C:
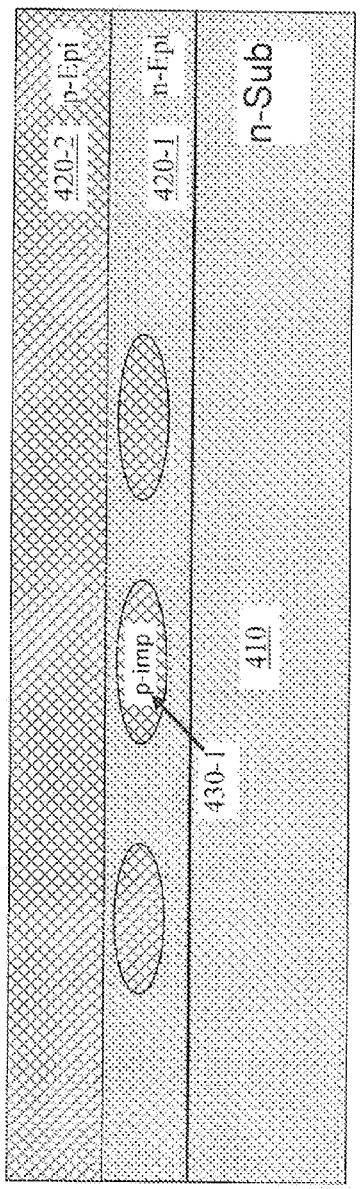
Figure 5D:
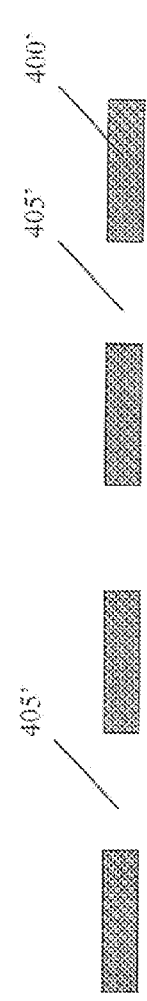

FIGS. 5A-5G are cross sectional views illustrating processing steps of another alternative method for making a superjunction structure. As shown in FIG. 5A, the manufacturing process starts with a semiconductor substrate 410, for example an n-type substrate. A first epitaxial layer 420-1 of a first conductivity type is grown on top of the substrate 410, which can be either an N-type or P-type epitaxial layer. FIG. 5A shows the first epitaxial layer 420-1 is N-type. A hard mask layer 400 is formed on top of the first epitaxial layer 420-1 and is patterned with a plurality of implant windows 405 through a photolithographic etching process. Dopants of second conductivity type, which is opposite with the first conductivity type, are implanted into the first epitaxial layer 420-1 through the implant windows 405 to form plurality of spaced apart doped regions 430-1 in the first epitaxial layer 420-1. Ions are implanted at the energy between 50 keV and 500 keV and a dose between 1e12 cm$^{-2}$ to 1e14 cm$^{-2}$. Preferably the doped regions 430-1 are implanted into a depth less than half the thickness of first epitaxial layer 420-1 such that after diffusion drive in the center of each diffusion region will be at a depth substantially half the thickness of the first epitaxial layer 420-1. In FIG. 5B, the doped regions 430-1 are P-type. The hard mask 400 is removed followed by growing a second epitaxial layer 420-2, which can be first or second conductivity type. FIG. 5C shows the second epitaxial layer 420-2 is P-type. Another hard mask 400' with implant windows 405' are applied on top of the structure with the implant windows 405' positioned at the appropriate places, i.e., the implant windows are positioned between the P-doped regions 430-1 as shown in FIG. 5D. In case the epitaxial layer 420-2 is N-type, the implant windows 405 will be positioned above the P-doped regions 430-1. Dopants of the opposite conductivity type with the second epitaxial layer 420-2 are implanted into the second epitaxial layer 420-2 through the implant windows 405 to form plurality of the space apart doped regions 430-2. Preferably each of the doped regions 430-2 is implanted at a lateral location substantially at a center between two space apart doped regions 430-1 and into a depth less than half the thickness of the second epitaxial layer 420-2 such that after diffusion drive in the center of each diffusion region 430-2 will be at a depth substantially half the thickness of the second epitaxial layer 420-2. FIG. 5E shows the doped regions 430-2 are N-type with the second epitaxial layer 420-2 being P-type. The hard mask 400 is then removed as shown in FIG. 5F. Each epitaxial layer has a thickness of about 0.5 μm to 10 μm and a dopant concentration between $1e14\ cm^{-3}$ to $1e18\ cm^{-3}$.

Figure 5G:
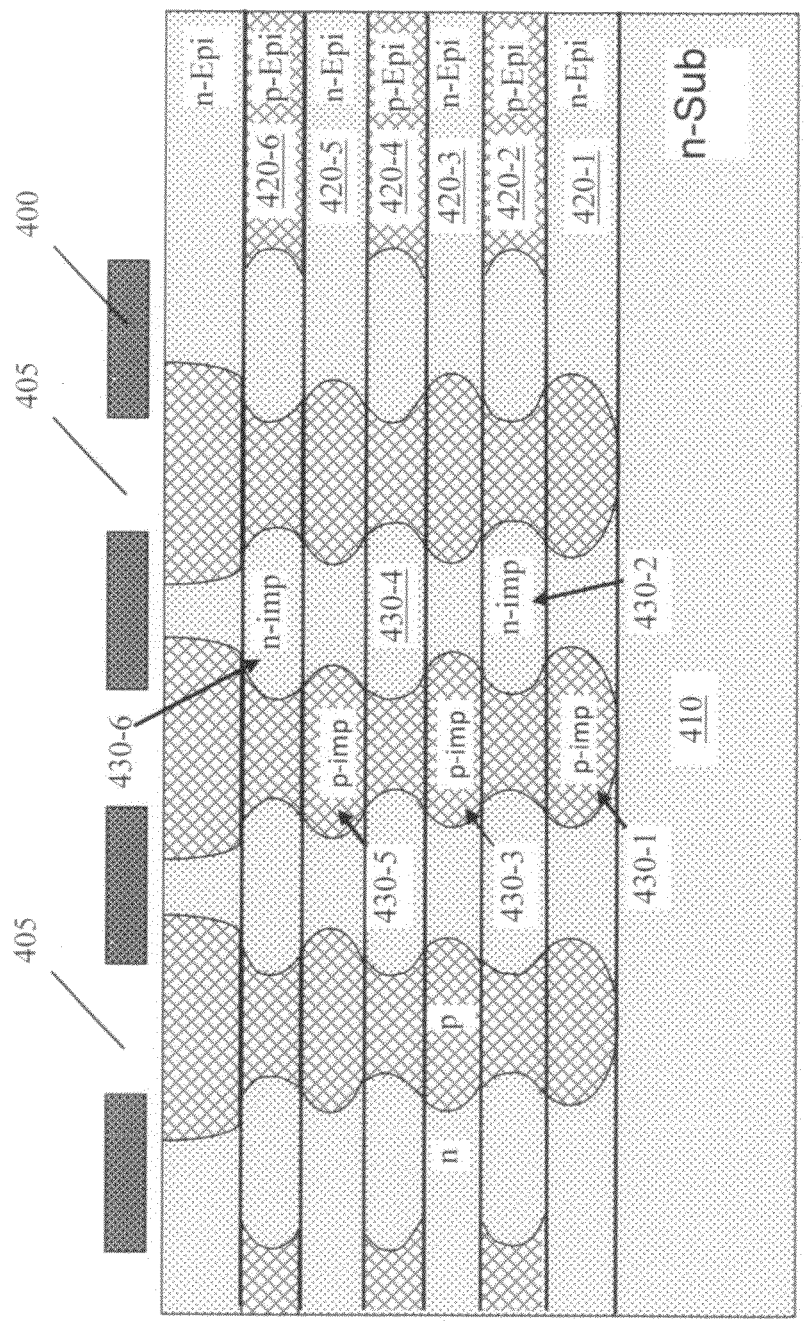

The processing steps shown in FIGS. 5C to 5F are repeated, for example, six to eight times to grow the epitaxial layers and implanting doped regions of the opposite conductivity type in each epitaxial layer at a depth less than half the thickness of each epitaxial layer such that after diffusion drive in the center of each diffusion region will be at a depth substantially half the thickness of the epitaxial layer. The doped regions of same conductivity type in different epitaxial layers are aligned with each other. FIG. 5G shows the superjunction structure includes six stacking epitaxial layers 420-1 to 420-6 of alternating conductivity type with the opposite conductivity type doped regions 430-1 to 430-6 respectively displaced in each epitaxial layer. The manufacturing processes proceed with the top side device manufacturing processes as that shown in FIG. 3 are carried out including a long diffusion by applying an elevated temperature to form the P-columns and N-columns through diffusion of doped regions as shown in FIG. 5G. Each P or N column comprises multiple evenly doped epitaxial regions and multiple diffused dopant profile regions of same conductivity type arranged alternately with each other. In one embodiment, each of the diffused regions has a convex sidewall boundary with a maximum lateral width located substantially in the center of the diffused region and a minimum width located at an interface with the epitaxial region of the same conductivity. In another embodiment each of the epitaxial regions has a concave sidewall boundary with a minimum lateral width located substantially in the center of the epitaxial region (or in the center of the epitaxial layer) and a maximum lateral width at the interface with the diffused region of the same conductivity. The diffused regions and the epitaxial regions in each column are preferably aligned and overlapped with each other respectively. In one embodiment the minimum lateral width of the diffused region is substantially the same as the maximum lateral width of the epitaxial region of the same conductivity.

One advantage of this process is that different p/n implant sequence can be applied to create flexible profile, for example pnpn (shown in FIG. 5G) or ppnn, etc. Such flexibility provides a mechanism to compensate any charge imbalance in each layer; in contrast to the prior art where such imbalances in each layer may accumulate when the same implant is repeated in each layer.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a semiconductor power device on a semiconductor substrate supporting a drift region thereon composed of a first epitaxial layer of a first conductivity type, the method comprising:
   1) forming a first hard mask layer on top of the first epitaxial layer
   2) applying a first implant mask to open a plurality of a first set of implanting windows then carrying out an implant with dopant ions of a second conductivity type to form a plurality of dopant regions of the second conductivity type in the first epitaxial layer, the second conductivity type being opposite to the first conductivity type;
   3) applying a second implanting mask to block a selected set of implanting windows among the first set of implanting windows for implanting dopant ions of the first conductivity type to form a plurality of dopant regions of the first conductivity type in the first epitaxial layer followed by removing the second implant mask and the first hard mask and then followed by forming a second epitaxial layer of the first conductivity type on top of the first epitaxial layer; and
   4) repeating the step 1) to step 3) by applying the same first and second implant masks to form a plurality of epitaxial layers each having dopant regions of alternating conductivity types vertically aligned according to the first and second implant masks.

2. The method of claim 1 further comprising:
carrying out a device manufacturing process on a top epitaxial layer on top of the plurality of epitaxial layers of alternating conductivity types; and
performing a diffusion process to form alternating conductivity type doped columns in the plurality of epitaxial layers.

3. The method of claim 2 wherein:
the steps of forming doped regions of the opposite conductivity type in each epitaxial layer further comprising implanting the doped regions alternating conductivity types in the plurality of epitaxial layers of N-type conductivity.

4. The method of claim 3 wherein:
the steps of forming doped regions of the opposite conductivity type in each epitaxial layer further comprising implanting dopants into a depth less than half the thickness of each epitaxial layer.

5. The method of claim 4 wherein:
the steps of performing a diffusion process to form the doped columns of the alternating conductivities further comprising a step of diffusing each of the doped regions in each of the epitaxial layers to diffuse approximately half a thickness of each of the epitaxial layers.

* * * * *